(12) United States Patent
Lee

(10) Patent No.: US 12,170,222 B2
(45) Date of Patent: Dec. 17, 2024

(54) SUBSTRATE SUPPORT ASSEMBLY FOR SUBSTRATE TREATMENT APPARATUS

(71) Applicant: DEVICEENG CO. LTD, Chungcheongnam-do (KR)

(72) Inventor: Taek Youb Lee, Chungcheongnam-do (KR)

(73) Assignee: DEVICEENG CO., LTD., Chungcheongnam-do (KR)

( * ) Notice: Subject to any disclaimer, the term of this patent is extended or adjusted under 35 U.S.C. 154(b) by 296 days.

(21) Appl. No.: 17/562,651

(22) Filed: Dec. 27, 2021

(65) Prior Publication Data
US 2023/0060570 A1 Mar. 2, 2023

(30) Foreign Application Priority Data
Aug. 24, 2021 (KR) .................. 10-2021-0111356

(51) Int. Cl.
*H01L 21/67* (2006.01)
*H01L 21/687* (2006.01)

(52) U.S. Cl.
CPC .. *H01L 21/68764* (2013.01); *H01L 21/67051* (2013.01); *H01L 21/68792* (2013.01)

(58) Field of Classification Search
CPC . H01L 21/67; H01L 21/051; H01L 21/68792; H01L 21/6704; H01L 21/67051; B08B 3/12; B08B 7/026; B08B 7/028; B08B 2203/0288
See application file for complete search history.

(56) References Cited

U.S. PATENT DOCUMENTS

| | | | |
|---|---|---|---|
| 5,954,072 A | 9/1999 | Matsusita | |
| 8,714,169 B2 | 5/2014 | Lee et al. | |
| 9,421,617 B2 | 8/2016 | Goodman | |
| 10,286,425 B2 * | 5/2019 | Sasaki | C11D 11/0047 |
| 2002/0078889 A1 * | 6/2002 | Welch | H01L 21/67259 |
| | | | 118/668 |
| 2004/0007257 A1 | 1/2004 | Park | |

(Continued)

FOREIGN PATENT DOCUMENTS

| | | |
|---|---|---|
| JP | 1996-069972 A | 3/1996 |
| JP | H10-209254 A | 8/1998 |

(Continued)

*Primary Examiner* — David G Cormier
(74) *Attorney, Agent, or Firm* — BLANK ROME LLP

(57) ABSTRACT

The present invention relates to a substrate support assembly for a substrate treatment apparatus, including: a chuck base supporting the substrate to be treated, disposed rotatable around a rotation axis, and having an installation accommodation portion formed near the outer peripheral surface thereof in a circumferential direction thereof and a receiving recess formed open on the top thereof at the inside surrounded by the installation accommodation portion; chuck pins disposed on the top of the installation accommodation portion of the chuck base and movable along directions away from and approaching the substrate; a mechanism unit disposed in the installation accommodation portion and connected to the chuck pins to move the chuck pins; a driving unit for transmitting power to the mechanism unit; and an ultrasonic cleaning unit disposed in the receiving recess.

14 Claims, 10 Drawing Sheets

(56) References Cited

U.S. PATENT DOCUMENTS

| | | | |
|---|---|---|---|
| 2004/0132318 A1* | 7/2004 | Kim | ................... B08B 3/12 |
| | | | 134/1 |
| 2010/0126539 A1 | 5/2010 | Lee | |
| 2010/0130020 A1 | 5/2010 | Kim | |
| 2011/0034034 A1 | 2/2011 | Du Bois | |
| 2013/0319472 A1 | 12/2013 | Frank et al. | |
| 2022/0172979 A1 | 6/2022 | Tonai | |
| 2023/0163018 A1 | 5/2023 | Satou | |
| 2023/0264232 A1* | 8/2023 | Lee | ................... B08B 3/12 |
| | | | 134/1 |

FOREIGN PATENT DOCUMENTS

| | | | | |
|---|---|---|---|---|
| KR | 20080030203 A | | 4/2008 | |
| KR | 20100001152 U | | 2/2010 | |
| TW | 202013595 A | * | 4/2020 | |
| WO | WO-2014074861 A1 | * | 5/2014 | ......... G01N 21/9505 |

\* cited by examiner

SUBSTRATE SUPPORT ASSEMBLY FOR SUBSTRATE TREATMENT APPARATUS

CROSS REFERENCE TO RELATED APPLICATION OF THE INVENTION

The present application claims the benefit of Korean Patent Application No. 10-2021-0111356 filed in the Korean Intellectual Property Office on Aug. 24, 2021, the entire contents of which are incorporated herein by reference.

BACKGROUND OF THE INVENTION

Field of the Invention

The present invention relates to a substrate support assembly for a substrate treatment apparatus, and more specifically, to a substrate support assembly for a substrate treatment apparatus that is capable of rotating a substrate in a state of supporting the substrate so as to perform semiconductor fabrication processes such as cleaning, drying, and the like.

Background of the Related Art

Generally, a semiconductor device is manufactured by depositing and patterning various materials on a substrate to the shape of thin films, and in the manufacturing process, different steps such as deposition, photolithography, etching, cleaning, and drying are needed.

Among them, the cleaning and drying processes are performed to remove foreign substances or particles from the substrate and to then dry the substrate. In a state where the substrate is supported on the top of a spin head (chuck base), first, a treatment liquid is supplied to the top or the underside of the substrate, while the spin head is rotating at a high speed.

To prevent the substrate from escaping from the spin head in a lateral direction of the spin head, generally, chuck pins are disposed on the spin head in a circumferential direction of the spin head, and in this case, a substrate support assembly is constituted of the chuck pins, the spin head, a mechanism unit, and a driving unit for driving the mechanism unit.

The chuck pins are reciprocated between holding positions where they hold the substrate onto the top of the spin head and releasing positions where they are separated from the substrate.

According to a conventional substrate support assembly, however, a cover is disposed on the top of a spin head disposed opposite to the underside of a substrate, and a material such as a cleaning liquid or gas is dispensed from a skirt disposed on the cover to clean the substrate.

According to the conventional substrate support assembly, however, it is hard to clean the underside of the substrate through a device having a different cleaning principle such as an ultrasonic unit.

SUMMARY OF THE INVENTION

Accordingly, the present invention has been made in view of the above-mentioned problems occurring in the related art, and it is an object of the present invention to provide a substrate support assembly for a substrate treatment apparatus that is capable of cleaning the underside of a substrate through a medium such as an ultrasonic unit.

To accomplish the above-mentioned objects, according to the present invention, there is provided a substrate support assembly for a substrate treatment apparatus, including: a chuck base supporting the substrate to be treated, disposed rotatable around a rotation axis, and having an installation accommodation portion formed near the outer peripheral surface thereof in a circumferential direction thereof and a receiving recess formed open on the top thereof at the inside surrounded by the installation accommodation portion; chuck pins disposed on the top of the installation accommodation portion of the chuck base and movable along directions away from and approaching the substrate; a mechanism unit disposed in the installation accommodation portion and connected to the chuck pins to move the chuck pins; a driving unit for transmitting power to the mechanism unit; and an ultrasonic cleaning unit disposed in the receiving recess.

According to the present invention, desirably, the chuck base may include a drain hole penetratedly formed on the receiving recess bottom or the side peripheral wall thereof.

According to the present invention, desirably, the drain hole formed on the receiving recess bottom of the chuck base is adjacent to the inner side periphery of the installation accommodation portion.

According to the present invention, desirably, the chuck base may include an insertion hole formed on the center of the receiving recess bottom to insert a lower protrusion of the ultrasonic cleaning unit and a blocking wall protruding upwardly from the receiving recess bottom adjacent to the insertion hole to surround the outer peripheral surface of the lower protrusion of the ultrasonic cleaning unit.

According to the present invention, desirably, the ultrasonic cleaning unit is movable up and down in directions approaching or away from the substrate.

According to the present invention, desirably, in a plan view, the ultrasonic cleaning unit is extended radially about the rotation axis.

According to the present invention, desirably, in a plan view, the ultrasonic cleaning unit becomes enlarged in width toward the front end thereof from the center of the rotation axis and constant in width from a given position thereof.

According to the present invention, desirably, the ultrasonic cleaning unit may include an internal cleaning passage formed at the inside thereof to receive a cleaning liquid and dispense the cleaning liquid to the substrate and one or more external cleaning liquid supply nozzles disposed on the outside thereof.

According to the present invention, desirably, when in a plan view, the internal cleaning passage is formed on the center of the ultrasonic cleaning unit in a width direction of the ultrasonic cleaning unit near the center of the chuck base.

According to the present invention, desirably, the ultrasonic cleaning unit may include an internal cleaning liquid supply nozzle disposed on the outside thereof and connected to the inlet of the internal cleaning passage, and in a plan view, the internal cleaning liquid supply nozzle has a supply portion extended therefrom toward the center of an outlet of the internal cleaning passage.

According to the present invention, desirably, the outlet of the internal cleaning passage is formed on the top of the ultrasonic cleaning unit, and the internal cleaning passage is slanted toward the substrate, so that in a plan view, at least one of both radial ends of the outlet of the internal cleaning passage exposed to the top of the ultrasonic cleaning unit is located on a side behind the center of the rotation axis along the extended direction of the ultrasonic cleaning unit.

According to the present invention, desirably, in a side view, a direction of the internal cleaning passage is in the range of 10 to 80° with respect to the direction of the rotation axis.

According to the present invention, desirably, in a plan view, the external cleaning liquid supply nozzles are slanted in the radial direction about the rotation axis to thus have rotating direction components of the chuck base and components toward the edge periphery of the substrate, and through the external cleaning liquid supply nozzles, the cleaning liquid is dispensed to the range of ⅕ to ⅘ of the length of the ultrasonic cleaning unit toward the edge periphery of the substrate from the center of the substrate.

According to the present invention, desirably, the substrate support assembly may further include a first through-beam sensor disposed on a lower fixing frame spaced apart from the chuck base under the chuck base to sense the substrate, a through-beam hole formed on the receiving recess bottom of the chuck base to pass the light emitted from the first through-beam sensor therethrough, and a second through-beam sensor disposed on an upper fixing frame spaced apart from the substrate above the substrate to sense the light emitted from the first through-beam sensor.

According to the present invention, desirably, the chuck base may include a sealing window disposed on the receiving recess bottom to cover and seal the through-beam hole and to pass the light therethrough, and the sealing window is located on one or more positions thereof.

BRIEF DESCRIPTION OF THE DRAWINGS

The above and other objects, features and advantages of the present invention will be apparent from the following detailed description of the embodiments of the invention in conjunction with the accompanying drawings, in which.

DETAILED DESCRIPTION OF THE PREFERRED EMBODIMENT

Hereinafter, an embodiment of the present invention will be explained in detail with reference to the attached drawings.

Figure 1:
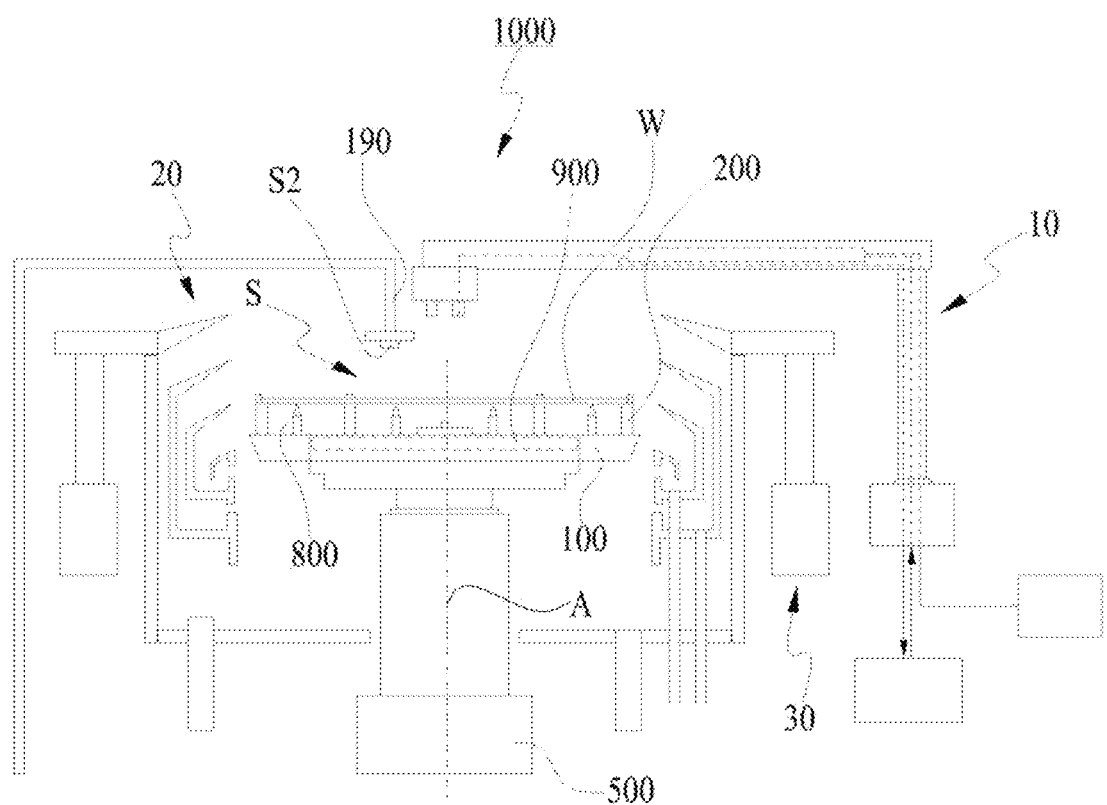
FIG. 1 is a side sectional view showing a substrate treatment apparatus adopted in a substrate support assembly for a substrate treatment apparatus according to the present invention.

As shown in FIG. 1, a substrate treatment apparatus 1000 of the present invention includes a fluid supply unit 10, a bowl assembly 20, an ascending and descending unit 30, and the substrate support assembly S.

The fluid supply unit 10 supplies substrate treatment fluids such as treatment liquid or gases to a substrate W.

The substrate support assembly S serves to rotate the substrate W in a state of supporting the substrate W, while a given treatment is being carried out.

The bowl assembly 20 serves to receive chemical liquids used for treatments and fumes generated during the treatment to prevent the chemical liquids and fumes from scattering or flowing to the outside and has a stacked structure of bowls so that different kinds of chemical liquids and fumes are separatedly introduced thereinto according to relative heights of the bowls to the substrate W.

The ascending and descending unit 30 serves to move up and down the substrate support assembly S or the bowl assembly 20 to change a relative height between the bowl assembly 20 and the substrate support assembly S within the bowl assembly 20.

Figure 2:
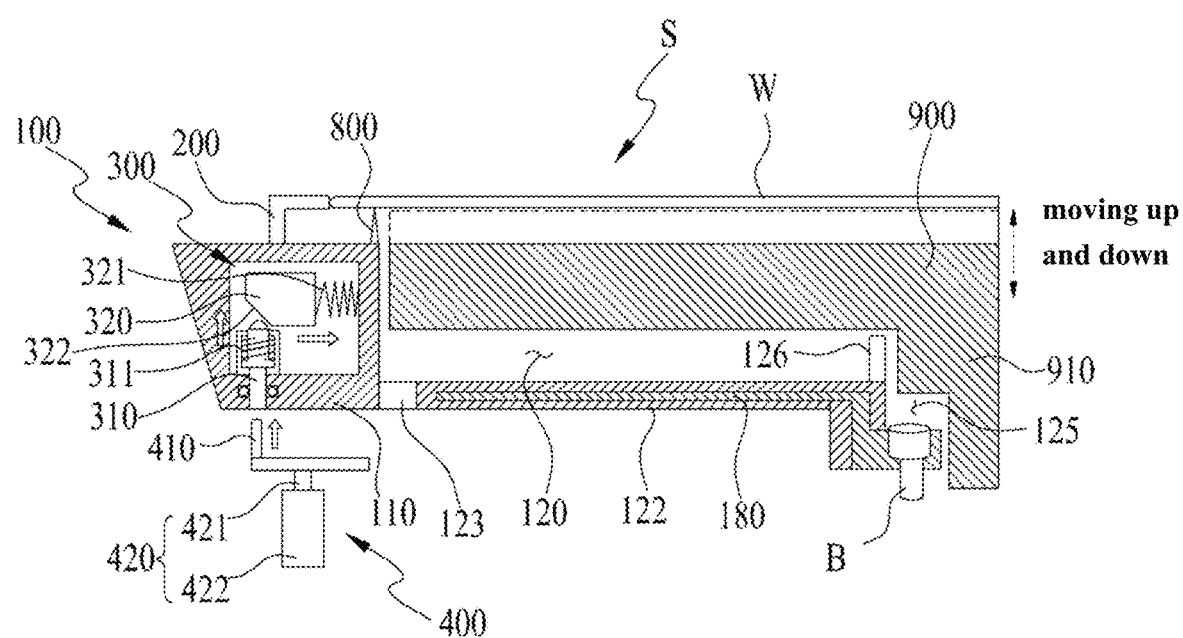
FIG. 2 is a side sectional view showing the substrate support assembly for a substrate treatment apparatus according to the present invention.

As shown in FIG. 2, the substrate support assembly S includes a chuck base 100 supporting a substrate W to be treated, disposed rotatable around a rotation axis A perpendicular to the supported substrate W, and having an installation accommodation portion 110 of ring shape extending along the circumferential direction with respect to the rotation axis A and a receiving recess bottom 122 disposed at the inner lower part surrounded by the installation accommodation portion 110 and connected to the installation accommodation portion 110, wherein an receiving recess 120 is formed by the receiving recess bottom 122 and the inside surface of the installation accommodation portion 110, and formed open on the top thereof, chuck pins 200 disposed on the top of the installation accommodation portion 110 of the chuck base 100 and movable along directions away from and approaching the substrate W, a mechanism unit 300 disposed in the installation accommodation portion 110 and connected to the chuck pins 200 to move the chuck pins 200, a driving unit 400 for transmitting power to the mechanism unit 300, and an ultrasonic cleaning unit 900 disposed in the receiving recess 120.

Further, the substrate support assembly S includes support pins 800 disposed on the top of the chuck base 100 to support the substrate W.

As the mechanism unit 300 is intensively disposed in the installation accommodation portion 110 formed in the lower part near the outer peripheral surface of the chuck base 100 in the circumferential direction of the chuck base 100 and the ultrasonic cleaning unit 900 is disposed in the receiving recess 120 formed on the center of the chuck base 100, the underside of the substrate W can be cleaned through the ultrasonic waves generated from the ultrasonic cleaning unit 900.

In specific, if the support pins 800 are adjusted in position to allow the inner peripheral surface of the installation accommodation portion 110 to become close to the outer peripheral surface of the substrate W and the ultrasonic unit 900 is almost fitted to the receiving recess 120, the ultrasonic cleaning can be performed uniformly over the entire surface of the substrate W.

The chuck pins 200 may be bent toward the substrate W in consideration of their relative positions to the mechanism unit 300.

A chemical liquid such as a cleaning liquid or drying liquid supplied above or under the substrate W is introduced into the receiving recess 120.

To allow the chemical liquid introduced into the receiving recess 120 to be discharged or circulated to the outside, without being accumulatedly collected therein, desirably, a drain hole 123 is penetratedly formed on the receiving recess bottom 122 (See FIG. 2) or the side peripheral wall (See FIG. 3) of the chuck base 100.

Moreover, as shown in FIG. 2, if the drain hole 123 is formed on the receiving recess bottom 122 of the chuck base 100, the drain hole 123 is adjacent to the inner side periphery of the installation accommodation portion 110, so that the chemical liquid introduced into the receiving recess 120 is rapidly discharged and easily moves to the drain hole 123 of the receiving recess bottom 122 by means of the centrifugal force generated during the rotation of the chuck base 100.

Further, the chuck base 100 includes an insertion hole 125 formed on the center of the receiving recess bottom 122 to insert a lower protrusion 910 of the ultrasonic cleaning unit 900 and a blocking wall 126 protruding upwardly from the receiving recess bottom 122 adjacent to the insertion hole 125 to surround the outer peripheral surface of the lower protrusion 910 of the ultrasonic cleaning unit 900.

Through the blocking wall 126, the chemical liquid introduced into the receiving recess 120 is prevented from flowing to a motor 500 (See FIG. 1) through the insertion hole 125.

Further, the ultrasonic cleaning unit 900 is fixed to the rotating direction of the chuck base 100, but is movable up and down in directions becoming approaching or away from the substrate W to thus adjust ultrasonic intensity, so that a degree of cleaning for the substrate W can be controlled.

Figure 3:
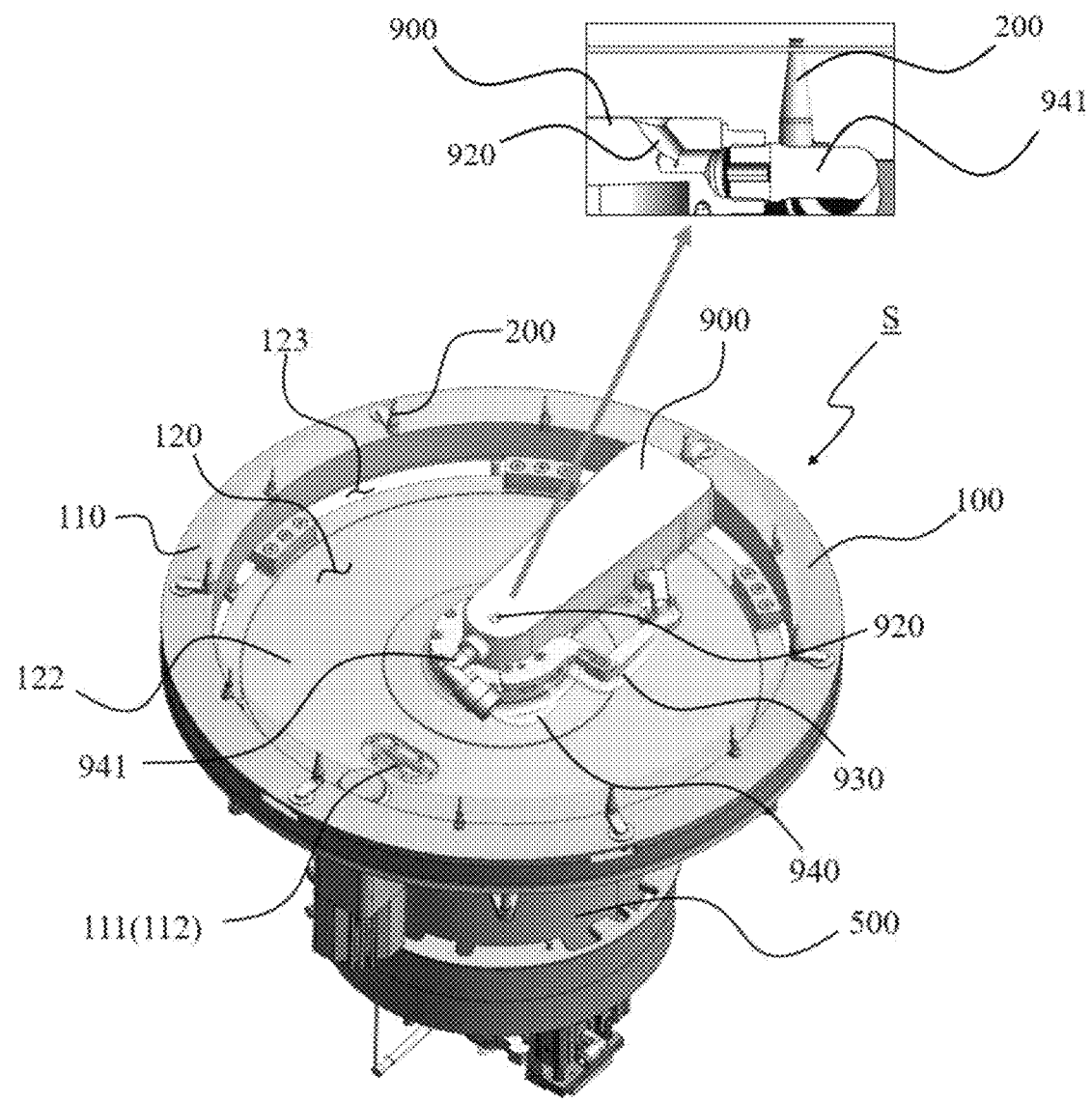
FIG. 3 is a perspective view showing the substrate support assembly for a substrate treatment apparatus according to the present invention.
Figure 4:
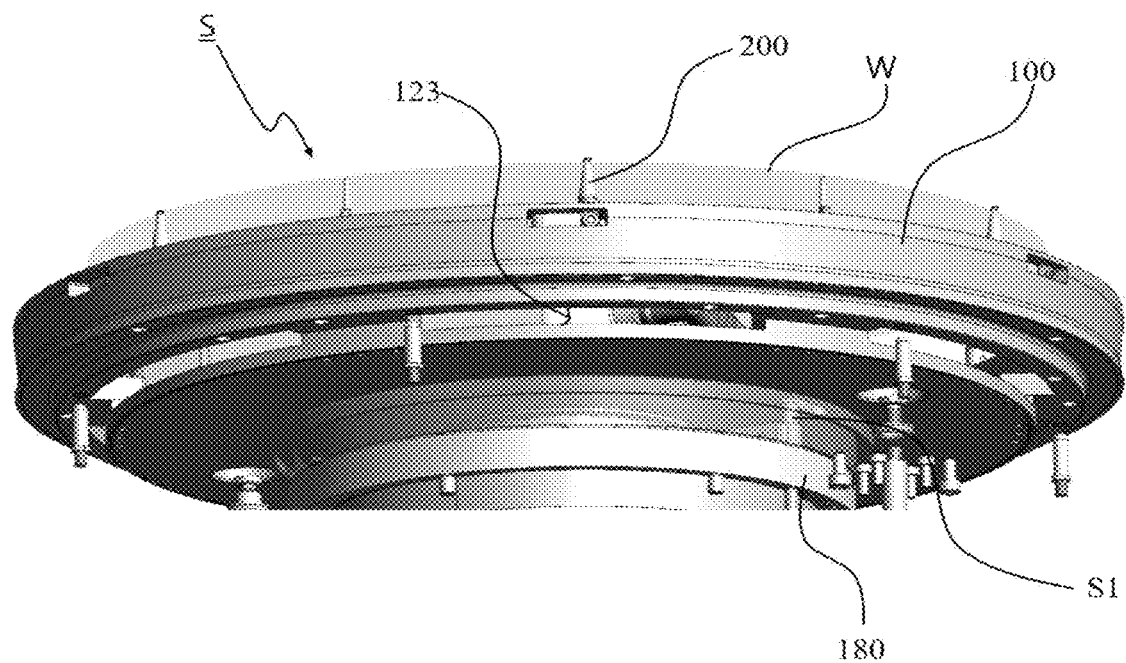
FIG. 4 is a perspective view showing underside of the substrate support assembly according to the present invention.
Figure 5:
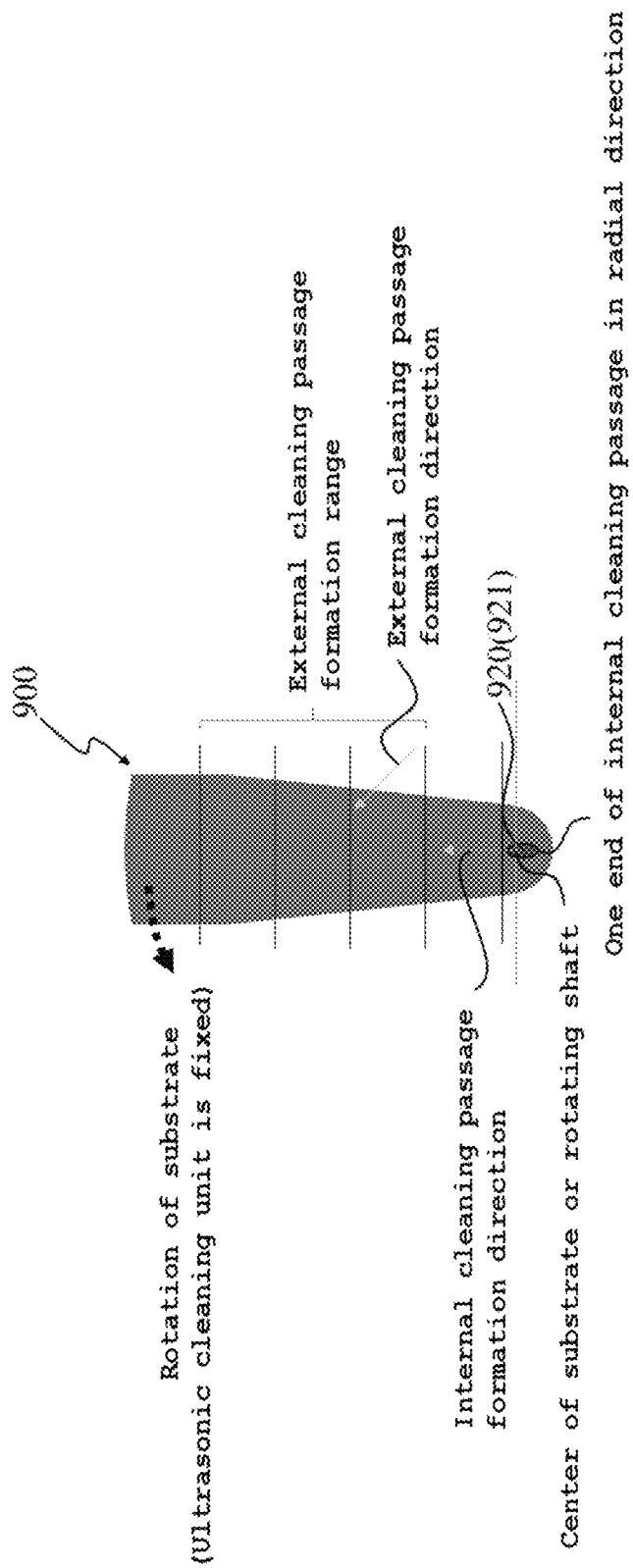
FIG. 5 is a diagram showing installation positions and dispensing directions of nozzles of an ultrasonic cleaning unit of FIG. 4.

In a plan view, as shown in FIGS. 3 and 4, the ultrasonic cleaning unit 900 is extended radially about the rotation axis A (See FIG. 1), and as shown in FIG. 5, the ultrasonic cleaning unit 900 becomes enlarged in width toward the front end thereof from the center of the rotation axis A, while being constant in width from a given positions, that is, having outer walls parallel to each other.

Accordingly, the area of the ultrasonic cleaning unit 900 occupied on the receiving recess bottom 122 can be minimized.

The ultrasonic cleaning unit 900 has an internal cleaning passage 920 formed at the inside thereof to receive a cleaning liquid and dispense the cleaning liquid to the substrate W and one or more external cleaning liquid supply nozzles 930 disposed on the outside thereof to uniformly dispense the cleaning liquid to the substrate W.

In a side view, as shown in FIG. 3, a direction of the internal cleaning passage 920 is desirably greater than 0° and less than 90° with respect to the direction of the rotation axis A, more desirably greater than 10° and less than 80°.

Desirably, through the internal cleaning passage 920, the cleaning liquid is dispensed to the center of the substrate W, that is, the region close to the rotation axis A, and through the external cleaning liquid supply nozzles 930, the cleaning liquid is dispensed to the region close to the edge periphery of the substrate W.

In the case where the cleaning liquid is dispensed through both of the internal cleaning passage 920 and the external cleaning liquid supply nozzles 930, of course, an area in which the cleaning liquid is overlaidly dispensed to the substrate W may be generated, but the cleaning efficiency may not be low at all.

In a plan view, the internal cleaning passage 920 is formed at the center of the ultrasonic cleaning unit 900 in a width direction of the ultrasonic cleaning unit 900 near the center of the chuck base 100, that is, the center of the rotation axis A.

Further, the ultrasonic cleaning unit 900 has an internal cleaning liquid supply nozzle 940 disposed on the outside thereof and connected to the inlet of the internal cleaning passage 920, and in a plan view, the internal cleaning liquid supply nozzle 940 has a supply portion 941 extended therefrom toward the center of an outlet 921 of the internal cleaning passage 920 so that when the cleaning liquid is dispensed, it does not collide against the wall of the internal cleaning passage 920 and is prevented from being dispersed.

Further, as shown in FIG. 5, the outlet 921 of the internal cleaning passage 920 is formed on the top of the ultrasonic cleaning unit 900, and the internal cleaning passage 920 is slanted toward the substrate W. In a plan view, if at least one of both radial ends of the outlet of the internal cleaning passage 920 exposed to the top of the ultrasonic cleaning unit 900 is located on a side behind the center of the rotation axis A along the extended direction of the ultrasonic cleaning unit 900, a starting point of the internal cleaning passage 920 inside the ultrasonic cleaning unit 900 is located behind the center of the rotation axis A or the center of the substrate W with respect to a dispensing direction, and accordingly, the cleaning liquid is applied even to a portion behind the center of the ultrasonic cleaning unit 900, thereby completely cleaning the ultrasonic cleaning unit 900.

In a plan view, as shown in FIGS. 3 and 5, external cleaning passages formed by the external cleaning liquid supply nozzles 930 are slanted in the radial direction about the rotation axis A to thus have rotating direction components of the chuck base 100 and components toward the edge periphery of the substrate W, and the external cleaning passages are formed to dispense the cleaning liquid to the range of ⅕ to ⅘ of the length of the ultrasonic cleaning unit 900 toward the edge periphery of the substrate W from the center of the substrate W.

Accordingly, through the internal cleaning passage 920, the cleaning liquid is dispensed toward the radial direction of the substrate W, and through the external cleaning liquid supply nozzles 930, the cleaning liquid is dispensed toward both of the radial direction and the rotating direction of the substrate W, so that the cleaning liquid can be effectively dispensed to the entire area of the substrate W more uniformly.

Further, as shown in FIG. 4, a first through-beam sensor S1 is disposed on a lower fixing frame 180 spaced apart from the chuck base 100 under the chuck base 100 to sense the substrate W, a through-beam hole 111 is formed on the receiving recess bottom 122 of the chuck base 100 to pass the light emitted from the first through-beam sensor S1 therethrough, and a second through-beam sensor S2 is disposed on an upper fixing frame spaced apart from the substrate W above the substrate W to sense the light emitted from the first through-beam sensor S1.

If the substrate W hides the optical axis in the through-beam hole 111, it is recognized that the substrate W is seated onto the chuck pins 200, but while the substrate W seated onto the chuck pins 200 is being rotated, if the light is sensed by the second through-beam sensor S2 for a given period of time, it is automatically determined that the substrate W is not seated onto the chuck pins 200 or damaged.

In this case, a sealing window 112 is disposed on the receiving recess bottom 122 of the chuck base 100 to cover and seal the through-beam hole 111 and to pass the light therethrough, and desirably, the through-beam hole 111 and the sealing window 112 may be located on one or more positions to check the seated states of the substrate W at the plurality of positions.

As shown in FIGS. 6 to 10, the mechanism unit 300 includes a first operating piece 310 returnably movable in a direction of the rotation axis A by means of the driving unit 400 and a second operating piece 320 having one side coming into contact with the first operating piece 310 along a longitudinal direction thereof, allowing the chuck pin 200 to be disposed on the other side thereof, and returnably moving around a hinge shaft 330 disposed on the chuck base 100 between one side and the other side thereof.

The first operating piece 310 is movable up and down along two guide rods 318 disposed vertically in the installation accommodation portion 110.

The hinge shaft 330 is disposed on the second operating piece 320 and rotatably coupled to the chuck base 100, and the technology related to the hinge shaft will be obviously understood to a person having ordinary skill in the art.

Under the above-mentioned configuration, if the driving unit 400 operates to move the first operating piece 310, the second operating piece 320 coming into contact with the first operating piece 310 moves, and accordingly, the chuck pin 200 connected to the second operating piece 320 moves to the direction away from the substrate W and thus stays at its standby position. Otherwise, the chuck pin 200 moves to the direction approaching the substrate W and thus stays at its holding position.

Under the simple configuration, that is, the chuck pin 200 moves between its standby position and its holding position to minimize the horizontal section (volume) of the installation accommodation portion 110.

Figure 8:
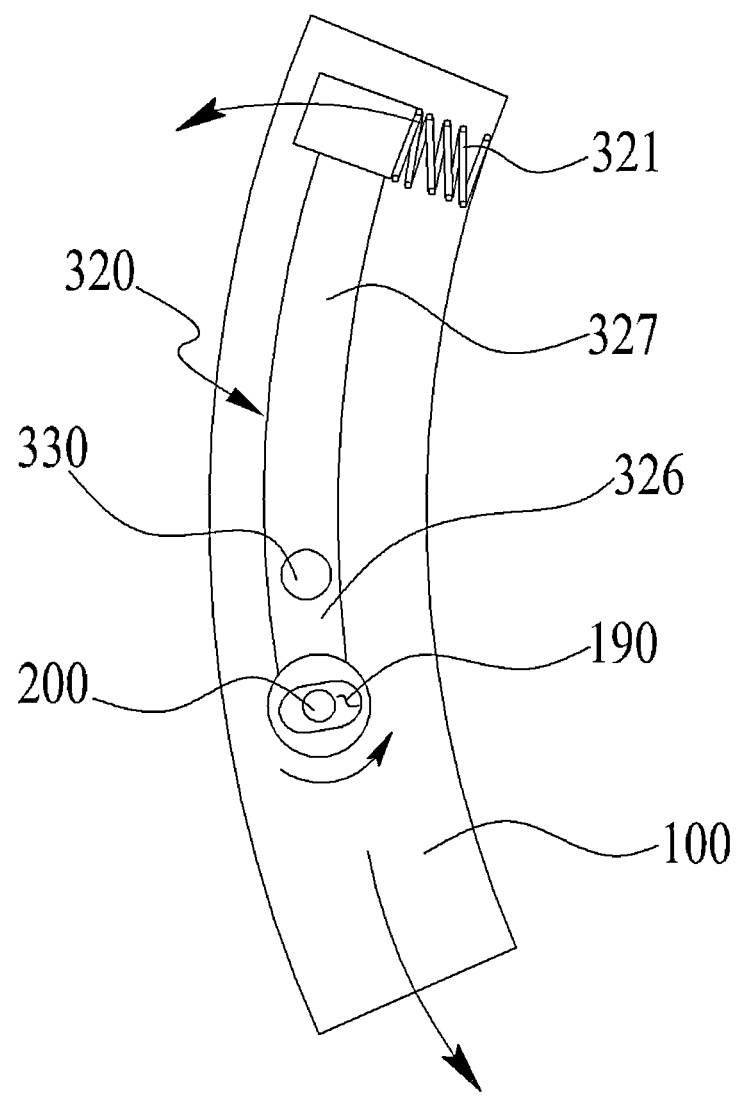
FIG. 8 is a plan view showing an operating structure of a second operating piece of the mechanism unit in the substrate support assembly according to the present invention.

In this case, a guide hole 190 is formed on a top cover 150 of the chuck base 100 to allow the chuck pin 200 to be reciprocated between its standby and holding positions (See FIG. 8).

Further, a slant surface 322 is formed on the underside of one side of the second operating piece 320 coming into contact with the first operating piece 310, and as the first operating piece 310 moves up in the direction of the rotation axis A, the top of the first operating piece 310 pushes the slant surface 322 of the second operating piece 320 to allow the second operating piece 320 to move around the hinge shaft 330.

Moreover, the first operating piece 310 and the second operating piece 320 are returnably movable so that if the driving unit 400 does not operate, the chuck pin 200 is always placed on its holding position.

In specific, a first spring 311 applying a restoring force or a first magnet (not shown) applying a magnetic force is disposed between the first operating piece 310 and the chuck base 100 so that the chuck pin 200 becomes distant from the substrate W in the direction of the rotation axis A, and a second spring 321 applying a restoring force or a second magnet (not shown) applying a magnetic force is disposed between the second operating piece 320 and the chuck base 100 so that the chuck pin 200 moves to its holding position.

In the drawings, the first spring 311 is a compression spring disposed in up and down directions, and the second spring 321 is a compression spring disposed horizontally.

In this case, of course, it is obvious to a person having ordinary skill in the art that the springs may be appropriately changed in their arrangement direction.

Further, a portion 326 of the second operating piece 320, which is oriented toward the chuck pin 200 from the hinge shaft 330, is located above a portion 327 of the second operating piece 320, which is oriented toward the first operating piece 310, and the portion 326 oriented toward the chuck pin 320 is separated from the portion 327 oriented toward the first operating piece 310 in an up and down direction by means of a separation wall 130.

Under the above-mentioned configuration, if the top cover 150 of the chuck base 100 is open, the second operating pieces 320 are exposed to the outside, and the first operating pieces 310 are sealed under the separation walls 130. As a result, the exchange and maintenance of the chuck pins 200 can be easily achieved, while the first operating pieces 310 are being not influenced by external environments.

As shown in FIG. 8, in a plan view, the second operating piece 320 is extended to the shape of an arch along the circumferential direction of the chuck base 100 so that when the second operating piece 320 moves around the hinge shaft 330, it does not interfere with the chuck base 100 to the maximum extent.

Figure 6:
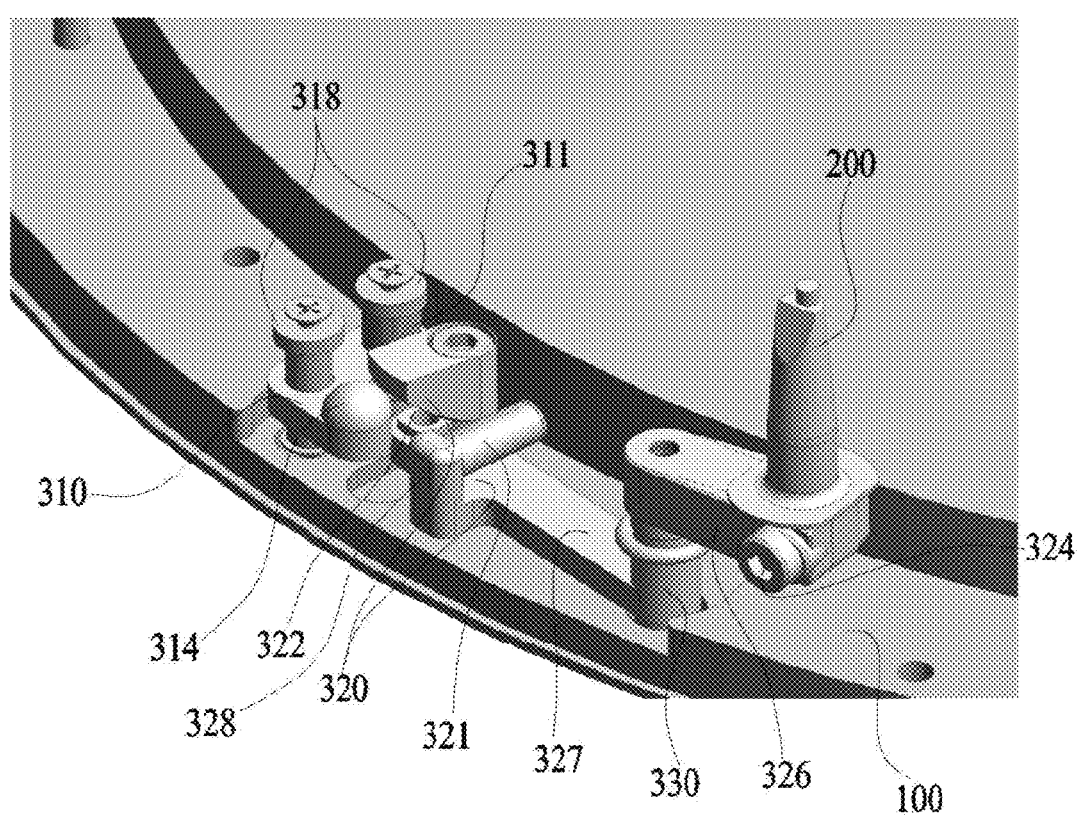
FIG. 6 is a perspective view showing the top of a mechanism unit in the substrate support assembly according to the present invention.
Figure 9:
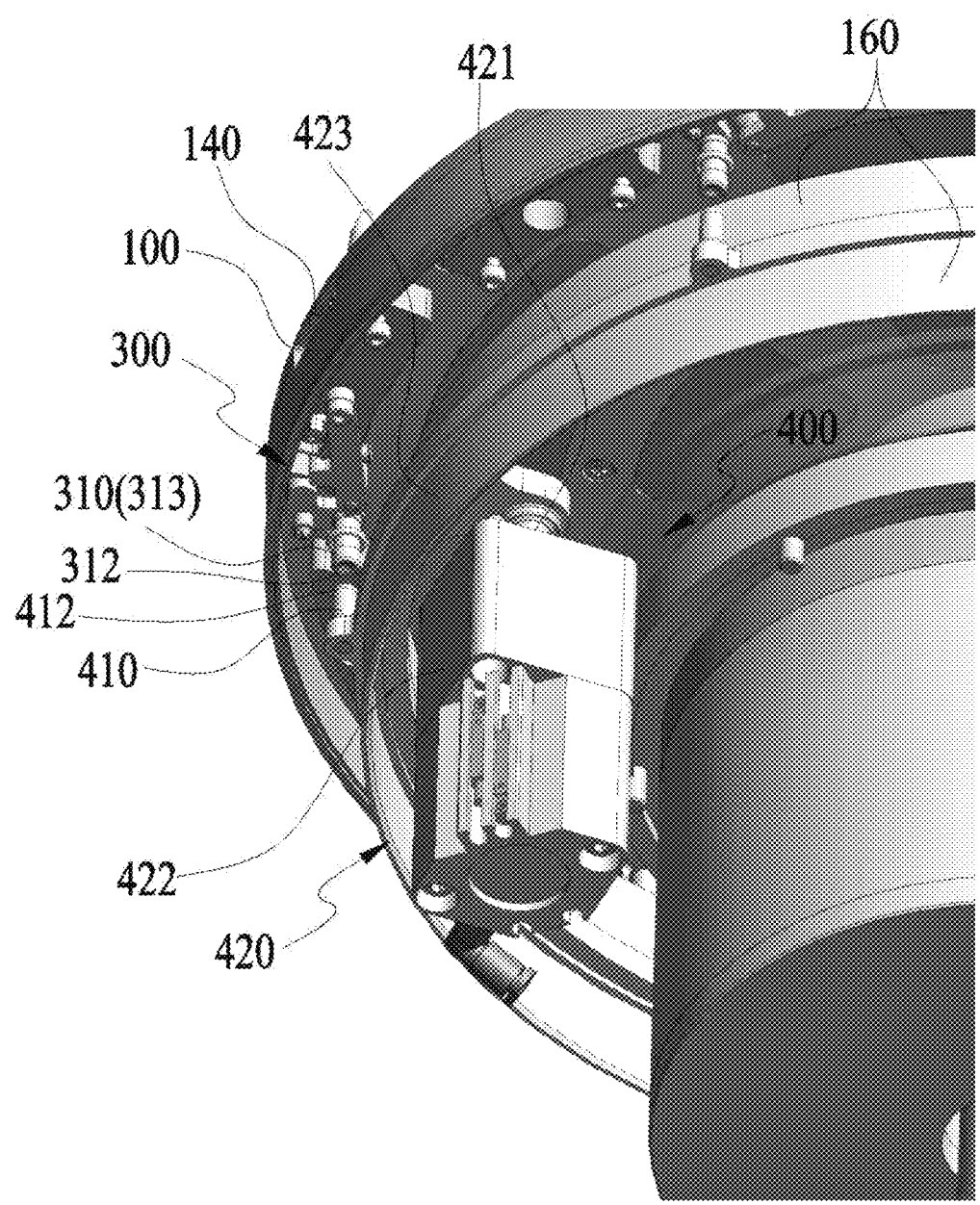
FIG. 9 is a perspective view showing underside of a portion of the substrate support assembly according to the present invention.
Figure 10:
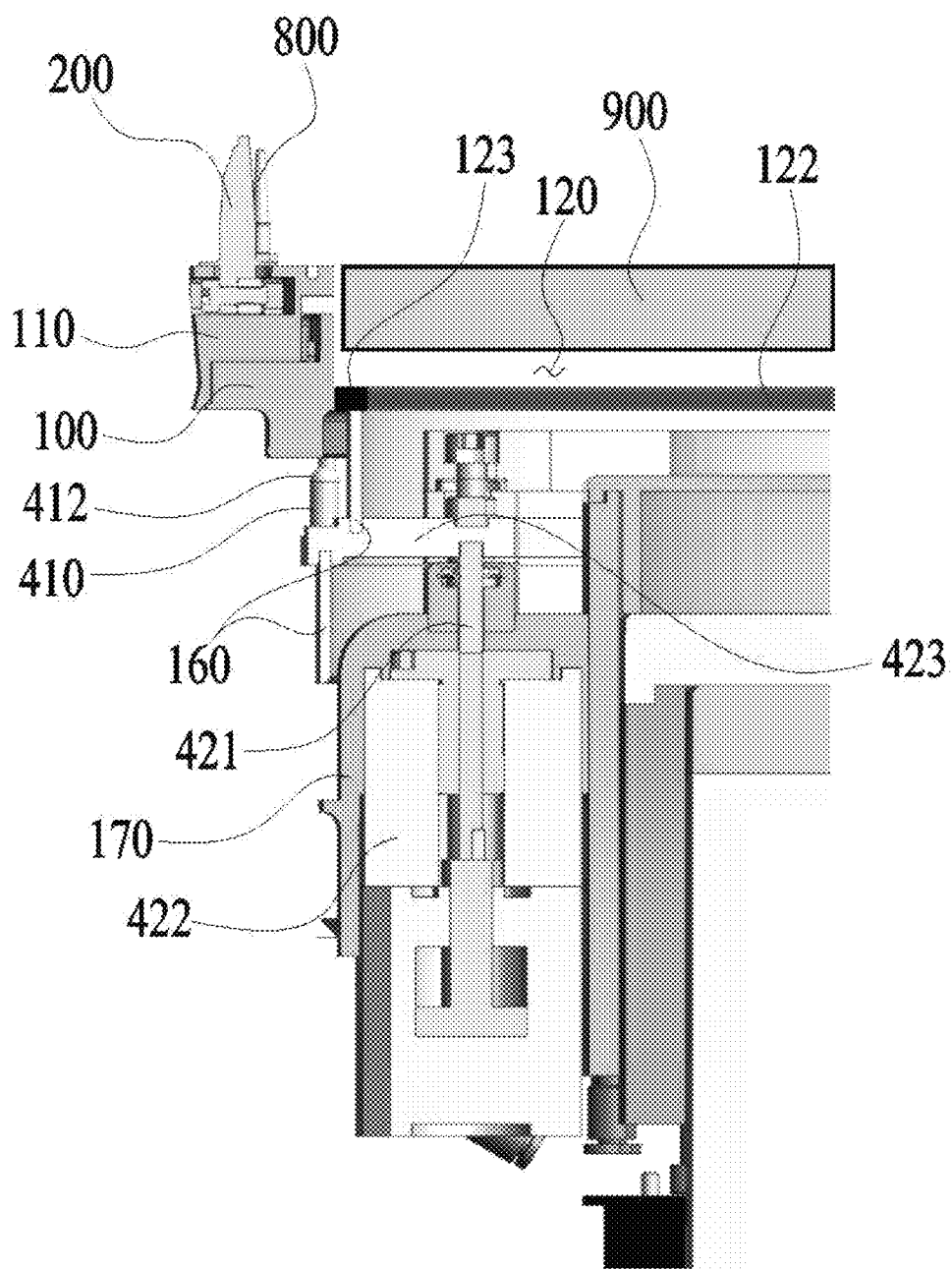
FIG. 10 is a longitudinal sectional view showing a portion of the substrate support assembly according to the present invention.

As shown in FIGS. 6 and 9, further, the chuck base 100 has checkup holes 140 formed along the outer peripheral surface thereof to allow the portions 326 oriented toward the chuck pins 200 to be exposed to the outside, so that the connection states of the chuck pins 200 can be easily checked to the outside.

Further, a fastening hole 324 is exposed to the outside through the checkup hole 140, and as a tool such as a wrench is fitted to the fastening hole 324, the chuck pin 200 can be easily separated from the second operating piece 320.

As shown in FIG. 8, desirably, a weight of the portion 327 oriented toward the first operating piece 310 is greater than a weight of the portion 326 oriented toward the chuck pin 200.

Under the above-mentioned configuration, the portion 327 oriented toward the first operating piece 310 has a greater moment than the portion 326 oriented toward the chuck pin 200 from the hinge shaft 330 through the centrifugal force generated during the rotation of the chuck base 100, so that the chuck pin 200 pressurizes the side periphery of the substrate W by means of the application of the centrifugal force to thus allow the substrate W to be more firmly held thereby during the rotation of the chuck base 100.

As shown in FIG. 9, the driving unit 400 includes a pusher 410 coming into contact with the first operating piece 310 of the mechanism unit 300 and a driver 420 connected to the pusher 410.

The pusher 410 is ascended by the operation of the driver 420 to move up the first operating piece 310.

In this case, the first operating piece 310 has a connection groove 312 formed on the underside thereof, and the pusher 410 has an operating protrusion 412 protruding from the top thereof and coupled to the connection groove 312 of the first operating piece 310.

Through the coupling between the connection groove 312 and the operating protrusion 412, the pusher 410 can be slidingly coupled to the first operating piece 310 with ease even if the axes of the centers of the connection groove 312 and the operating protrusion 412 do not correspond to each other.

The first operating piece 310 includes a first portion 313 coming into contact with the pusher 410 and a second portion 314 coming into contact with the slant surface 322 of the second operating piece 320.

Figure 7:
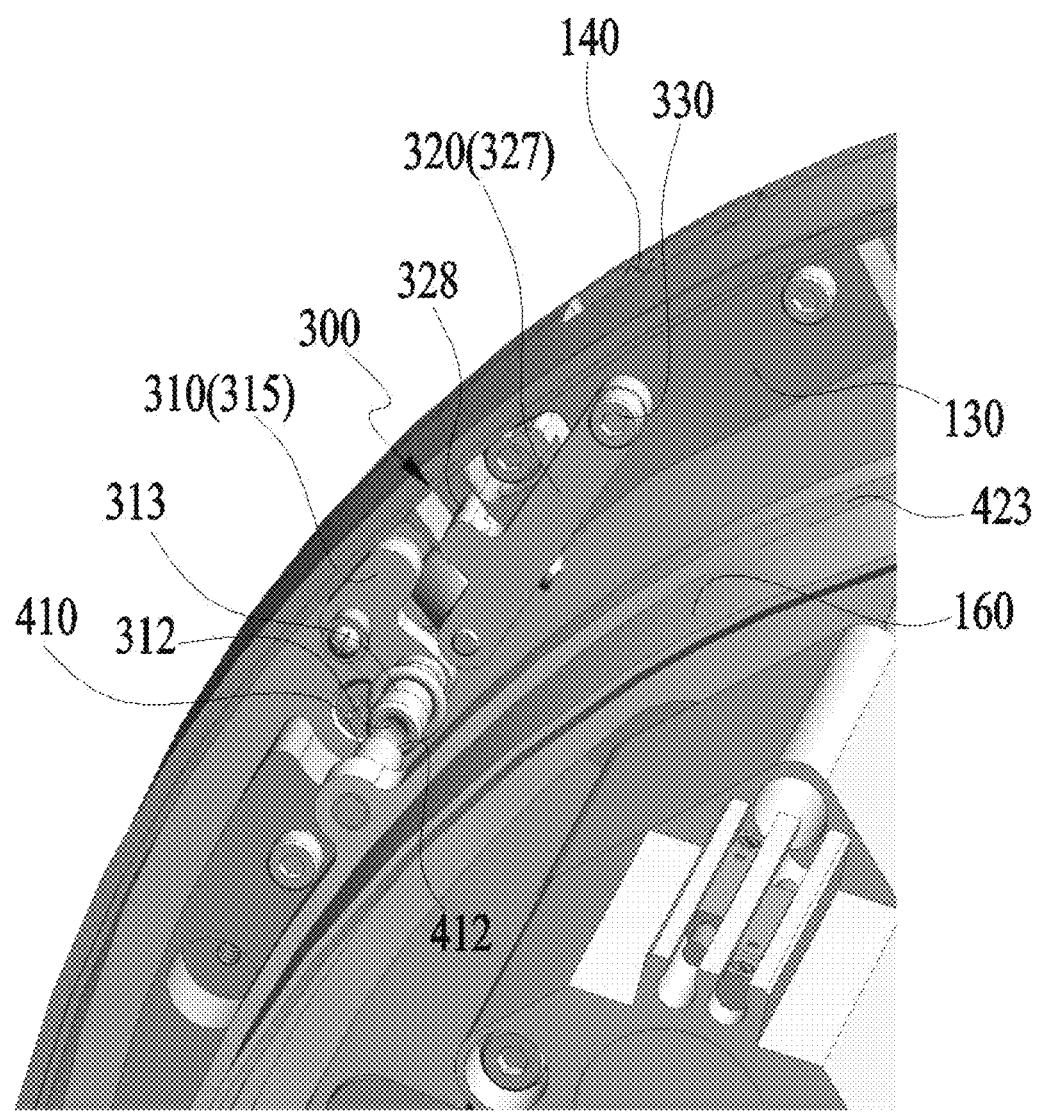
FIG. 7 is a perspective view showing underside of the mechanism unit in the substrate support assembly according to the present invention.

As shown in FIGS. 6 and 7, the first portion 313 and the second portion 314 are formed on both ends of a '¬'-shaped bent plate 315 of the first operating piece 310. Accordingly, the connection groove 312 is formed on the first portion 313, and the second portion 314 comes into contact with the slant surface 322 of the second operating piece 320.

Moreover, the second operating piece 320 has a protrusion 328 extended upwardly from one longitudinal point thereof, and the second spring 321 is placed between the inner side of the protrusion 328 and the inner surface of the installation accommodation portion 110 to apply an elastic restoring force.

Further, as shown in FIG. 9, the driver 420 includes a support frame 423 with the plurality of pushers 410 disposed thereon in the circumferential direction thereof, a pressurizing rod 421 connected to the support frame 423 and spaced apart from the pusher 410 inwardly, and a driving source 422 spaced apart from the pusher 410 inwardly and connected to the pressurizing rod 421, and desirably, a curtain wall 160 is disposed between the pusher 410 and the pressurizing rod 421.

Under the above-mentioned configuration, mist such as a chemical liquid generated during the rotation of the chuck base 100 is prevented from being introduced into the driving source 422 or the pressurizing rod 421 and thus avoided from being influenced badly thereby.

Further, a housing 170 is additionally disposed to seal the driving source 422, and the driving source 422 and the pressurizing rod 421 are connected to each other through the top of the housing 170 to prevent the driving source 422 from being damaged by external influences such as mist.

In addition, as shown in FIG. 2, the chuck pins 200, the second operating pieces 320, a conductive medium 180 constituting the chuck base 100, and a motor 500 for rotating the chuck base 100 are electrically connected and grounded, so that the generation of an electrostatic force from the substrate W is prevented to thus keep the quality of a product from being influenced badly by the electrostatic force.

The second operating pieces 320 and the conductive medium 180 may be made of a conductive material such as a conductive metal or a conductive material containing carbon.

A reference symbol B of FIG. 2 indicates a bolt fastened to the motor 500.

Further, if two or more sets of assemblies each having the chuck pin 200, the mechanism unit 300 and the driving unit 400 are equally spaced apart from one another around the rotation axis A in the circumferential direction of the chuck base 100, they can balancedly support the substrate W.

As described above, the substrate support assembly for the substrate treatment apparatus according to the present invention is configured to have the mechanism unit intensively disposed in the installation accommodation portion formed near the outer peripheral surface of the chuck base in the circumferential direction of the chuck base and the ultrasonic cleaning unit disposed in the receiving recess formed on the center of the chuck base, so that the underside of the substrate can be cleaned through the ultrasonic cleaning unit.

According to the present invention, further, if the support pins are adjusted in position to allow the inner peripheral surface of the installation accommodation portion to become close to the outer peripheral surface of the substrate and the ultrasonic unit is almost fitted to the receiving recess, the ultrasonic cleaning can be performed uniformly over the entire surface of the substrate.

According to the present invention, moreover, the drain hole is penetratedly formed on the receiving recess bottom or the side peripheral wall of the chuck base to allow the chemical liquid introduced into the receiving recess to be discharged or circulated to the outside, without being accumulatedly collected therein.

According to the present invention, also, the formation of the drain hole allows the chemical liquid introduced into the receiving recess to be rapidly discharged and easily move to the drain hole of the receiving recess bottom by means of the centrifugal force generated during the rotation of the chuck base.

According to the present invention, in addition, the chuck base is configured to have the insertion hole formed on the center of the receiving recess bottom to insert the lower protrusion of the ultrasonic cleaning unit and the blocking wall protruding upwardly from the receiving recess bottom adjacent to the insertion hole to surround the outer peripheral surface of the lower protrusion of the ultrasonic cleaning unit, so that through the blocking wall, the chemical liquid introduced into the receiving recess can be prevented from flowing to the motor through the insertion hole.

According to the present invention, further, the ultrasonic cleaning unit is movable up and down in the directions becoming approaching or away from the substrate to thus adjust ultrasonic intensity, so that a degree of cleaning for the substrate can be controlled according to kinds of substrates.

According to the present invention, moreover, the ultrasonic cleaning unit is extended radially about the rotation axis, and the ultrasonic cleaning unit becomes enlarged in width toward the front end thereof from the center of the rotation axis, while being constant in width from a given positions, that is, having outer walls parallel to each other, so that the area of the ultrasonic cleaning unit occupied on the receiving recess bottom can be minimized.

According to the present invention, also, the ultrasonic cleaning unit is configured to have the internal cleaning passage formed at the inside thereof to receive the cleaning liquid and dispense the cleaning liquid to the substrate and one or more external cleaning liquid supply nozzles disposed on the outside thereof to uniformly dispense the cleaning liquid to the substrate, so that through the internal cleaning passage, the cleaning liquid can be dispensed to the region close to the center of the substrate, and through the external cleaning liquid supply nozzles, the cleaning liquid can be dispensed to the region close to the edge periphery of the substrate, thereby achieving uniform dispensing to the substrate.

According to the present invention, additionally, the ultrasonic cleaning unit is configured to have the internal cleaning liquid supply nozzle disposed on the outside thereof and connected to the inlet of the internal cleaning passage, and in a plan view, the internal cleaning liquid supply nozzle has the supply portion extended therefrom toward the center of an outlet of the internal cleaning passage, so that when the cleaning liquid is dispensed, it cannot collide against the wall of the internal cleaning passage and can be prevented from being dispersed.

According to the present invention, further, the outlet of the internal cleaning passage is formed on the top of the ultrasonic cleaning unit, the internal cleaning passage is slanted toward the substrate, and in a plan view, if at least one of both radial ends of the outlet of the internal cleaning passage exposed to the top of the ultrasonic cleaning unit is located on a side behind the center of the rotation axis along the extended direction of the ultrasonic cleaning unit, the starting point of the internal cleaning passage inside the ultrasonic cleaning unit is located behind the center of the substrate (or the center of the rotation axis) with respect to the dispensing direction, and accordingly, the cleaning liquid is applied even to a portion behind the center of the ultrasonic cleaning unit, thereby completely cleaning the ultrasonic cleaning unit.

According to the present invention, besides, the first through-beam sensor for sensing the substrate is disposed on the lower fixing frame spaced apart from the chuck base under the chuck base, the through-beam hole is formed on the receiving recess bottom of the chuck base to pass the light emitted from the first through-beam sensor therethrough, and the second through-beam sensor for sensing the light emitted from the first through-beam sensor is disposed on the upper fixing frame spaced apart from the substrate above the substrate, so that if the substrate hides the optical axis in the through-beam hole, it is recognized that the substrate is seated onto the chuck pins, but while the substrate seated onto the chuck pins is being rotated, if the light is sensed by the second through-beam sensor for a given period of time, it is automatically determined that the substrate is not seated onto the chuck pins or damaged.

According to the present invention, further, the sealing window is disposed on the receiving recess bottom of the chuck base to cover and seal the through-beam hole and to pass the light therethrough, and if the through-beam hole and the sealing window may be located on one or more positions, the seated states of the substrate can be checked on the plurality of positions.

The present invention may be modified in various ways and may have several exemplary embodiments. It is therefore intended that the scope of the invention be limited not by this detailed description, but rather by the claims appended hereto, and it should be understood that the invention covers all the modifications, equivalents, and replacements within the idea and technical scope of the invention.

What is claimed is:

1. A substrate support assembly for a substrate treatment apparatus, comprising:
    a chuck base supporting a substrate to be treated, disposed rotatable around a rotation axis perpendicular to the supported substrate, and having an installation accommodation portion of ring shape extending along a circumferential direction with respect to the rotation axis and a receiving recess bottom disposed at an inner lower part surrounded by the installation accommodation portion and connected to the installation accommodation portion, wherein a receiving recess is formed by the receiving recess bottom and an inside surface of the installation accommodation portion, and formed open on the top thereof;
    chuck pins disposed on the top of the installation accommodation portion of the chuck base and movable along directions away from and approaching the substrate;
    a mechanism unit disposed in the installation accommodation portion and connected to the chuck pins to move the chuck pins;
    a driving unit for transmitting power to the mechanism unit; and
    an ultrasonic cleaning unit disposed in the receiving recess,
    wherein, in a plan view, the ultrasonic cleaning unit is extended radially about the rotation axis.

2. The substrate support assembly according to claim 1, wherein the chuck base comprises a drain hole penetratedly formed on the receiving recess bottom or a side peripheral wall thereof.

3. The substrate support assembly according to claim 2, wherein the drain hole formed on the receiving recess bottom of the chuck base is adjacent to the inner side periphery of the installation accommodation portion.

4. The substrate support assembly according to claim 1, wherein the chuck base comprises:
    an insertion hole formed on the center of the receiving recess bottom to insert a lower protrusion of the ultrasonic cleaning unit; and
    a blocking wall protruding upwardly from the receiving recess bottom adjacent to the insertion hole to surround the outer peripheral surface of the lower protrusion of the ultrasonic cleaning unit.

5. The substrate support assembly according to claim 1, wherein the ultrasonic cleaning unit is movable up and down in directions approaching or away from the substrate.

6. The substrate support assembly according to claim 1, wherein in a plan view, the ultrasonic cleaning unit becomes enlarged in width toward a front end thereof from the center of the rotation axis and constant in width from a given position thereof.

7. The substrate support assembly according to claim 1, wherein the ultrasonic cleaning unit comprises:
    an internal cleaning passage formed at the inside thereof to receive a cleaning liquid and dispense the cleaning liquid to the substrate; and
    one or more external cleaning liquid supply nozzles disposed on the outside thereof.

8. The substrate support assembly according to claim 7, wherein in a plan view, the internal cleaning passage is formed on the center of the ultrasonic cleaning unit in a width direction of the ultrasonic cleaning unit near the center of the chuck base.

9. The substrate support assembly according to claim 8, wherein the ultrasonic cleaning unit comprises an internal cleaning liquid supply nozzle disposed on the outside thereof and connected to an inlet of the internal cleaning passage, and in a plan view, the internal cleaning liquid supply nozzle has a supply portion extended therefrom toward the center of an outlet of the internal cleaning passage.

10. The substrate support assembly according to claim 7, wherein an outlet of the internal cleaning passage is formed on the top of the ultrasonic cleaning unit, and the internal cleaning passage is slanted toward the substrate, so that in a plan view, at least one of both radial ends of the outlet of the internal cleaning passage exposed to the top of the ultrasonic cleaning unit is located on a side behind the center of the rotation axis along the extended direction of the ultrasonic cleaning unit.

11. The substrate support assembly according to claim 10, wherein in a side view, a direction of the internal cleaning passage is in the range of 10 to 80° with respect to the direction of the rotation axis.

12. The substrate support assembly according to claim 7, wherein in a plan view, the external cleaning liquid supply nozzles are slanted in the radial direction about the rotation axis to thus have rotating direction components of the chuck base and components toward the edge periphery of the substrate, and through the external cleaning liquid supply nozzles, the cleaning liquid is dispensed to the range of ⅕ to ⅘ of the length of the ultrasonic cleaning unit toward the edge periphery of the substrate from the center of the substrate.

13. The substrate support assembly according to claim 1, further comprising:
- a first through-beam sensor disposed on a lower fixing frame spaced apart from the chuck base under the chuck base to sense the substrate;
- a through-beam hole formed on the receiving recess bottom of the chuck base to pass the light emitted from the first through-beam sensor therethrough; and
- a second through-beam sensor disposed on an upper fixing frame spaced apart from the substrate above the substrate to sense the light emitted from the first through-beam sensor.

14. The substrate support assembly according to claim 13, wherein the chuck base comprises a sealing window disposed on the receiving recess bottom to cover and seal the through-beam hole and to pass the light therethrough, and the sealing window is located on one or more positions thereof.

\* \* \* \* \*